United States Patent [19]
Berg et al.

[11] Patent Number: 5,982,658
[45] Date of Patent: Nov. 9, 1999

[54] MRAM DESIGN TO REDUCE DISSIMILAR NEAREST NEIGHBOR EFFECTS

[75] Inventors: Lonny L. Berg; Paul W. Cravens, both of Elk River; Allan T. Hurst, Anoka; Tangshiun Yeh, St. Paul, all of Minn.

[73] Assignee: Honeywell Inc., Minneapolis, Minn.

[21] Appl. No.: 08/962,518

[22] Filed: Oct. 31, 1997

[51] Int. Cl.⁶ ..................................................... G11C 11/15
[52] U.S. Cl. .......................... 365/158; 365/173; 365/171; 365/66; 365/8; 365/87
[58] Field of Search .................................. 365/158, 173, 365/171, 157, 66, 8, 87

[56] References Cited

U.S. PATENT DOCUMENTS

| | | | |
|---|---|---|---|
| 4,751,677 | 6/1988 | Daughton et al. | 365/158 |
| 4,829,476 | 5/1989 | Dupuis et al. | 365/158 |
| 4,918,655 | 4/1990 | Daughton | 365/173 |
| 5,012,444 | 4/1991 | Hurst, Jr. et al. | 365/173 |
| 5,636,159 | 6/1997 | Pohm | 365/158 |
| 5,640,343 | 6/1997 | Gallagher et al. | 365/171 |
| 5,793,697 | 8/1998 | Scheuerlein | 365/230.07 |

*Primary Examiner*—Viet Q. Nguyen
*Attorney, Agent, or Firm*—Gregory A. Bruns

[57] ABSTRACT

A magnetoresistive memory array which has a row of active sense lines with each sense line including magnetoresistive bits and word lines extending over the bits. Each active sense line ending in a termination bit having a configuration selected to cause an adjacent bit to experience a magnetic field similar to that experienced by the remaining bits in the sense line. An inactive sense line located at each end of the row of active sense lines.

6 Claims, 2 Drawing Sheets

MRAM DESIGN TO REDUCE DISSIMILAR NEAREST NEIGHBOR EFFECTS

BACKGROUND OF THE INVENTION

The present invention relates to ferromagnetic thin film memories and more particularly to the fabrication of a thin film magnetoresistive memory device. The process for manufacturing the magnetoresistive bit lines involves depositing one or more layers of magnetic material over an underlying layer or surface, and etching the deposited material to a desired configuration.

U.S. Pat. No. 4,731,757 dated Mar. 15, 1988, U.S. Pat. No. 4,780,848 dated Oct. 25, 1988, U.S. Pat. No. 5,060,193 dated Oct. 22, 1991, and U.S. Pat. No. 5,496,759 which are assigned to Honeywell Inc. include background material on magnetoresistive memories and are hereby incorporated by reference.

The process for forming a magnetoresistive memory device provides first and second layers of thin film ferromagnetic materials separated by a layer of non ferromagnetic material and formed into an elongated shape having tapered ends to provide a magnetic storage element or a magnetic bit. In use, information is kept as a binary bit having one of two alternative logic levels stored in the two layers or films by having the magnetization point in one direction or the other(but opposite in each of these layers to the direction in the other), generally along the easy axis of magnetization. If the direction of magnetization is caused to rotate from such a direction by external magnetic fields, the electrical resistance of the layers will change with this magnetization direction rotation because of the magnetoresistive properties of the films. Measurement of the resistance allows the state of the memory to be determined. It has been observed that some number of bits will fail after a number of repeated memory storage and retrieval operations, or read/write cycles. The failure mechanism is believed to be bit edge reversal which is sometimes called edge spin reversal. The elongated shape of the bit structure causes large demagnetization fields along the edge of the layers. In such large demagnetization fields, electron spins at the edge of the films are constrained to lie nearly parallel to these edges and the direction of elongation of these films. During read or write operations it is intended that bit edge reversal does not occur.

In the past, proposed methods to prevent bit edge reversal have included using a magnetic spacer at the bit edge, applying an external magnetic field, using antiferromagnetic film on the edge of the bit and magnetic hardening of the bit edge.

The geometric configuration of a storage element has a great influence on its ability to provide failure free operation with wide operating margins. Wide operating margins are necessary for the production of high reliability memory devices.

Thus, a need exists for an improved understanding of storage element geometric configurations which will provide a magnetoresistive memory bit which allows an unlimited number of read/write cycles without bit edge reversal.

SUMMARY OF THE INVENTION

The present invention solves these and other needs by providing a magnetoresistive memory array including a row of active sense lines with each sense line including a plurality of individual magnetoresistive bits; word lines extending, over said bits; means for selecting an individual bit by the coincidence of a word current and a sense current at a selected bit; each said active sense line terminating in a termination bit having a configuration selected to cause an adjacent bit to experience a similar magnetic field as a magnetic field experienced by the remaining bits in said active sense line; a first inactive sense line located at a first end of said memory array: and a second inactive sense line located at a second end of said memory array with said inactive sense lines causing neighboring bits located in adjacent active sense lines to experience the same magnetic field as other bits in the array.

DETAILED DESCRIPTION

Figure 1:
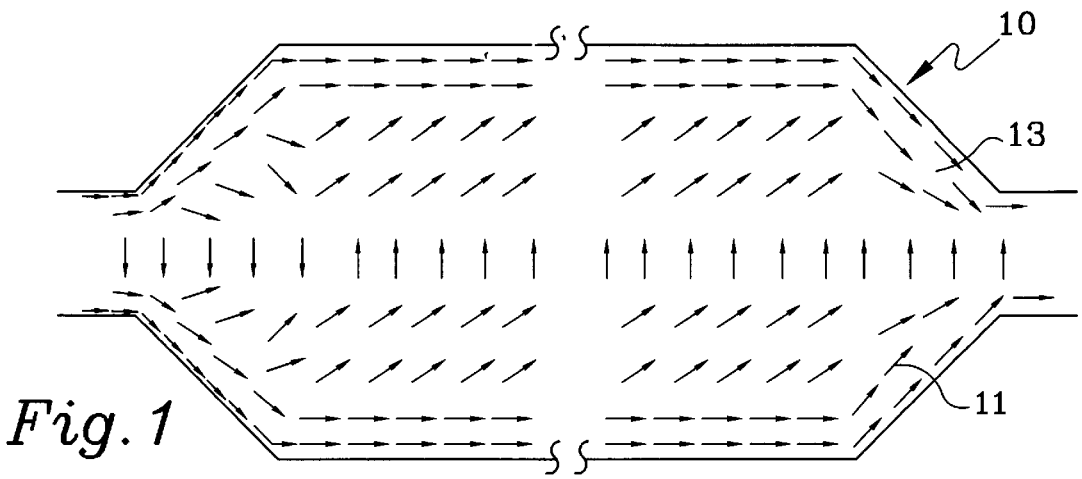
FIG. 1 is a plan view of a representation of a magnetoresistive storage element.

Coupled film magnetoresistive memory bits are known in the art and include a first magnetic layer, a second magnetic layer and an intermediate layer of nonmagnetic material. A representation of the magnetizations of a section of one of the magnetic layers or films is shown in FIG. 1. FIG. 1 shows the magnetizations for the storage of a logic value bit of information with the magnetizations at central locations shown pointed upward in that figure and edge magnetizations therein shown pointed primarily to the right. In a similar representation (not shown) of the magnetizations for the storage of an alternative logic value bit of information, the magnetizations at central locations would be shown pointed downward, and edge magnetizations would be shown still pointed primarily to the right. magnetization at the central location of the second film (not shown) would be opposite those of the first film. Note that the magnetization value gradually increases in the central portion of the film, that is away from the edge portions where the magnetization would remain in the same directions for both memory states. In the past it has been found that some small number of magnetoresistive bits fail after a number of read/write cycles. A read or write cycle includes the generation of a magnetic field by the bit itself and by a conductive metal strap (not shown) located on top of the bits. In some cases the magnetic field apparently causes the magnetization along a portion of the bit edge to be flipped into another direction. When this occurs, the bit fails and will no longer function. Note that in FIG. 1 in area 11, the magnetization is uniformly upwardly and to the right, whereas in area 13 the magnetization is not uniform, and magnetization at the edge is downward and to the right, while magnetization away from the edge is upward and to the right. There is evidence that a bit structure as shown in FIG. 1 is vulnerable to bit edge reversal in area 13. Once the bit edge reversal occurs at area 13, then after additional read/write cycles, the bit edge reversal seems to propagate to the left and the bit fails.

The geometric configuration of the magnetic storage element or bit, as well as the effect of the presence or absence of neighboring bits, effects the operation of the bit and the occurrence of bit edge reversal. A number of carefully designed experiments were developed to assess and understand the operation of the storage elements. Sixteen storage element geometric configurations were included on a mask set. This enabled direct comparison of the storage elements geometric effects on fully functional circuits all having identical CMOS processing. The experiments demonstrated that storage element geometry had a great influence on achieving wide operating margins.

Figure 2:
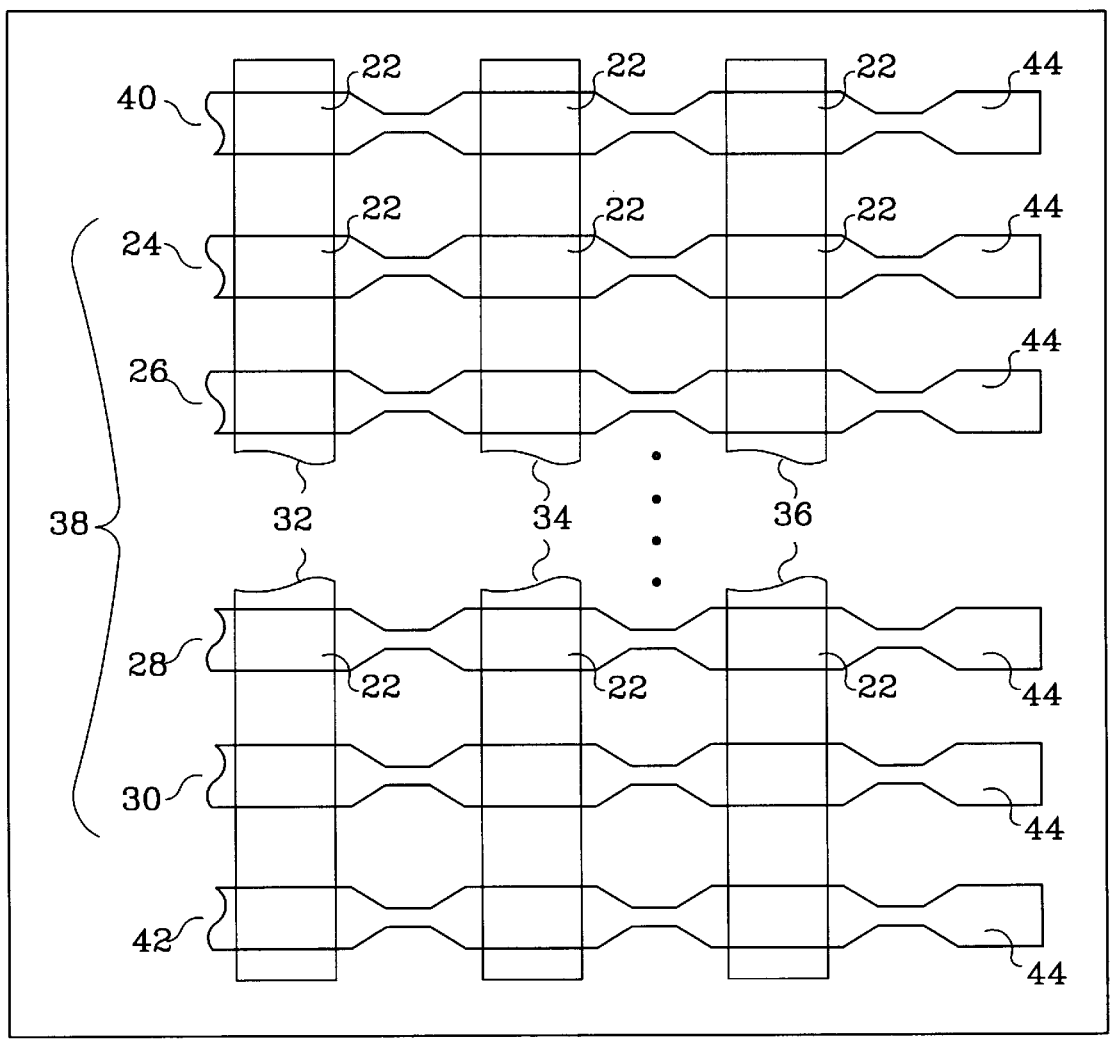
FIG. 2 is a plan view of a portion of a magnetoresistive memory array according to the principles of the present invention.

FIG. 2 shows a portion of a magnetoresistive memory array 20 according to the principles of the present invention including magnetoresistive bits 22 which are connected in rows of active sense lines 24, 26, 28, and 30 to make up a group 38 of active sense lines. Word lines 32,34 and 36 extend over columns of magnetoresistive bits 22. In operation the combination of a word current and a sense current identify or select a specific bit. Each sense line terminates at the right hand side of FIG. 2 in a termination bit 44. A contact (not shown) for connection to other circuits that are not shown is made at the termination bit.

Sense line 40 and sense line 42 are constructed identical to active sense lines 38. Sense line 40 and sense line 42 differ only in that they are extra sense lines located at each end of the rows of memory array 20. As extra sense lines they are not connected to other circuitry. Providing sense lines 40 and 42 is believed to result in at least two advantages. First the nature of the photolithography process used to form memory array 20 is such that the structure of the outermost sense line in each row will not be as uniform as the remaining sense lines. This non uniformity may be due to differences in light exposure of the outermost sense line during the photolithography process or other process variables that will cause the outermost sense lines to be slightly different. By providing an extra sense line at each end of the row, this non uniformity can be essentially eliminated. Second, there is an advantage to having each magnetic bit 22 experience the same magnetic field condition both in terms of the effect of a first bit on a nearest neighbor bit or the effect of the nearest neighbor bit on the first bit. By providing extra sense line 40 adjacent sense line 24, and extra sense line 42 adjacent to sense line 30, then sense lines 24 and 30 will experience magnetic field conditions more similar to the magnetic field conditions experienced by the remaining active sense lines.

The present invention uses a narrower bit width than those of the past to increase the demagnetized field of the bits so that a bit edge will not be as easily flipped into another direction. The demagnetized field of a narrow strip is believed to be proportional to the ratio of thickness of the ferromagnetic film (t) and the width (w) of the strips, i.e., t/w. For a fixed film thickness, t, the narrower the width, w, the higher the demagnetized field.

Figure 3:
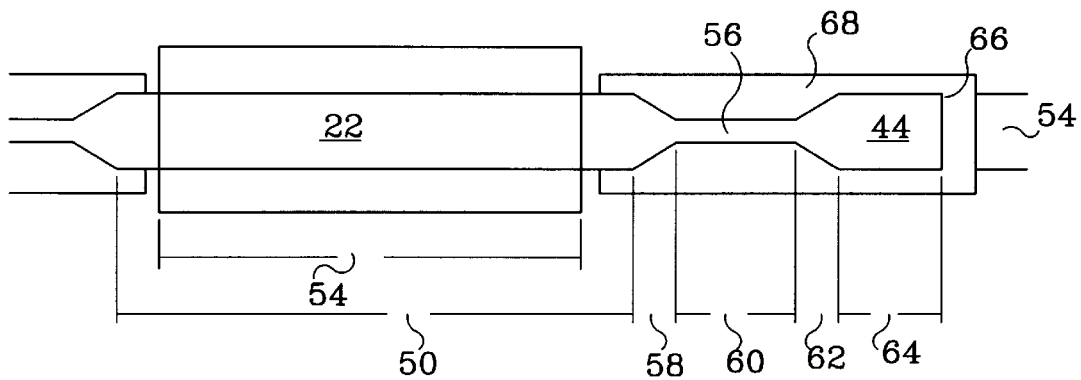
FIG. 3 is a plan view of a portion of the array of FIG. 2.

FIG. 3 shows an enlarged view of a portion of FIG. 2 and additional details of the construction of memory array 20. Bit length 50 is 10 microns, bit width 52 is 1.5 microns, word width 54 is 6 microns, neck width 56 is 0.7 microns, taper length 58 is 1 micron, neck length 60 is 3 microns, taper up length 62 is 1 micron, and termination bit length 64 is 3 microns. First metal 68 is also shown.

The use of a termination bit 44 is believed to be important so that an active bit 22 located to the immediate left of the termination bit 44 will see a magnetic field similar to the magnetic field seen by other bits 22 in the same sense line.

According to the principles of the present invention, the shape or configuration of termination bit 44 is important to the long term, failure free operation of memory array 20. The ending or termination of magnetoresistive material as occurs at the end of a sense line creates magnetic poles at the edge where the material ends. These magnetic poles can affect an adjacent bit in the same sense line. By moving the magnetic poles away from the adjacent bit and by spreading or distributing the magnetic poles this affect can be reduced. The shape of the bit terminations of FIG. 3 tend to both spread the magnetic poles along edge 66 and to move the magnetic poles away from the adjacent bit in the same sense line.

Figure 4:
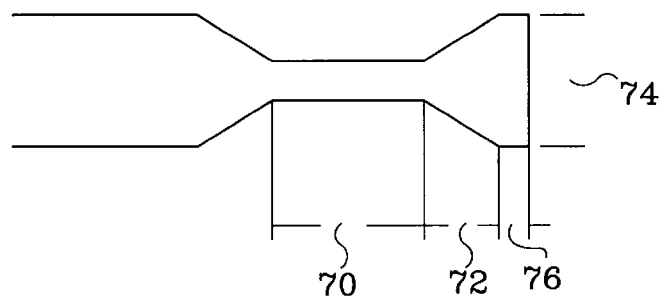
FIG. 4 is an alternative configuration of a portion of the array of FIG. 2.

FIG. 4 shows an alternative bit termination shape having a neck length 70, a taper up length 72, a bit width 74, and a termination bit length 76. Experiments conducted on this alternative configuration resulted in a greater number of bit failures than that of the shape of FIG. 3.

Figure 5:
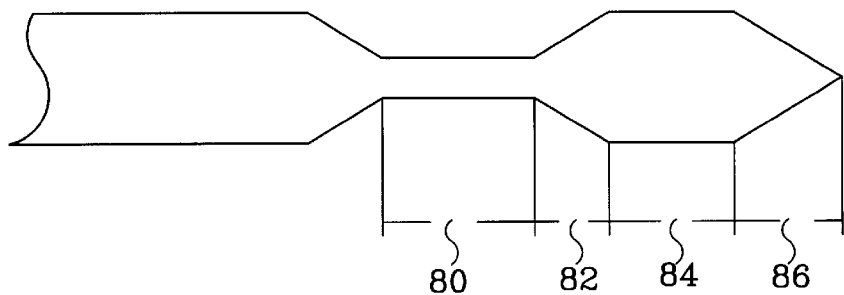
FIG. 5 is an alternative configuration of a portion of the array of FIG. 2.

FIG. 5 shows another alternative bit termination having a neck length 80, taper up length 82 straight length 84 and termination taper length 86. Experiments were conducted with various dimensions for the parameters recited in the previous sentence. The results of the experiments showed a significantly greater number of bit failures for this alternative configuration than for the shape as shown in FIG. 3.

The present invention provides a number of advantages. The present invention improves or widens the sense current operating margin and the word current operating margin. Margin is how wide the operating region can be without failures for a given varied parameter.

The present invention improves the bit yield, tightens the threshold variation across a die and improves the dynamic stability of a magnetoresistive memory device.

The present invention is applicable to both AMR and GMR technologies.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

We claim:

1. A magnetoresistive memory array comprising:

a row of active sense lines with each sense line including a plurality of individual magnetoresistive bits;

word lines extending over said bits;

means for selecting an individual bit by the coincidence of a word current and a sense current at a selected bit;

each said active sense line terminating in a termination bit having a configuration selected to cause an adjacent bit to experience a similar magnetic field as a magnetic field experienced by the remaining bits in said active sense line;

a first inactive sense line located at a first end of said memory array; and a second inactive sense line located at a second end of said memory array with said inactive sense lines causing neighboring bits located in adjacent active sense lines to experience a magnetic field similar to a magnetic field experienced by a remaining active sense line.

2. Magnetoresistive memory of claim 1 wherein said termination bit has a blunt end.

3. Magnetoresistive memory of claim 1 wherein said termination bit has a length and a width and a ratio of said length to said width is in the range of about 1 to about 3.

4. Magnetoresistive memory of claim 3 wherein said termination bit has a length and a width and a ratio of said length to said width is about 2.

5. Magnetoresistive memory of claim 4 wherein said width of said termination bit is about 1.5 microns.

6. Magnetoresistive memory array of claim 2 wherein an individual magnetoresistive bit has a width of about 1.5 microns and a length of about 10 microns.

* * * * *